United States Patent
Ohmi et al.

(10) Patent No.: US 8,030,182 B2
(45) Date of Patent: Oct. 4, 2011

(54) SEMICONDUCTOR DEVICE MANUFACTURING METHOD AND SEMICONDUCTOR MANUFACTURING APPARATUS

(75) Inventors: Tadahiro Ohmi, Miyagi (JP); Akinobu Teramoto, Miyagi (JP); Hiroshi Akahori, Miyagi (JP)

(73) Assignee: Tadahiro OHMI, Sendai-shi (JP)

( * ) Notice: Subject to any disclaimer, the term of this patent is extended or adjusted under 35 U.S.C. 154(b) by 565 days.

(21) Appl. No.: 11/992,230

(22) PCT Filed: Sep. 20, 2005

(86) PCT No.: PCT/JP2005/017260
§ 371 (c)(1),
(2), (4) Date: May 2, 2008

(87) PCT Pub. No.: WO2007/034534
PCT Pub. Date: Mar. 29, 2007

(65) Prior Publication Data
US 2009/0162995 A1 Jun. 25, 2009

(51) Int. Cl.
H01L 21/461 (2006.01)
B08B 7/04 (2006.01)
(52) U.S. Cl. ......... 438/471; 438/149; 438/150; 118/72; 118/73; 134/1; 134/1.3; 134/2; 257/E21.212
(58) Field of Classification Search .......... 438/471, 438/472, 149, 150, 705; 134/1, 1.3, 2, 3, 134/1.1, 1.2; 118/72, 73
See application file for complete search history.

(56) References Cited

U.S. PATENT DOCUMENTS

| | | | | | |
|---|---|---|---|---|---|
| 5,810,940 | A | * | 9/1998 | Fukazawa et al. | 134/3 |
| 5,944,907 | A | * | 8/1999 | Ohmi | 134/1.3 |
| 5,954,885 | A | * | 9/1999 | Ohmi | 134/1.3 |
| 5,972,123 | A | * | 10/1999 | Verhaverbeke | 134/3 |
| 6,003,243 | A | * | 12/1999 | Ohmi | 34/218 |
| 6,048,406 | A | * | 4/2000 | Misra et al. | 134/2 |
| 6,066,571 | A | * | 5/2000 | Usuda et al. | 438/745 |
| 6,346,505 | B1 | | 2/2002 | Morita et al. | |
| 6,348,157 | B1 | * | 2/2002 | Ohmi et al. | 210/760 |
| 2004/0108575 | A1 | * | 6/2004 | Ohmi et al. | 257/627 |

FOREIGN PATENT DOCUMENTS

| | | |
|---|---|---|
| JP | 7-086224 | 3/1995 |
| JP | 8-181094 | 7/1996 |
| JP | 11-060377 | 3/1999 |
| JP | 11-204485 | 7/1999 |
| JP | 11-307497 | 11/1999 |
| JP | 2001-054768 A | 2/2001 |
| JP | 2005-051141 A | 2/2005 |
| JP | 2005-136437 A | 5/2005 |

OTHER PUBLICATIONS

"Ideal anodization of silicon" Yamani, Zain, et al. Appl. Phys. Lett. 70 (25) Jun. 23, 1997.*
"Fundamentals of two-step etching techniques for ideal silicon-hydrogen termination of silicon(111)" Yang, S.-K. et al., J. Appl. Phys. 76 (7) Oct. 1, 1994.*

* cited by examiner

*Primary Examiner* — Kiesha Bryant
*Assistant Examiner* — Eric Ward
(74) *Attorney, Agent, or Firm* — Foley & Lardner LLP (57) ABSTRACT

By hydrogen-terminating a semiconductor surface using a solution containing $HF_2^-$ ions and an oxidant, the hydrogen termination can be quickly carried out. In this case, the semiconductor surface is silicon having a (111) surface, a (110) surface, or a (551) surface.

22 Claims, 11 Drawing Sheets

SEMICONDUCTOR DEVICE MANUFACTURING METHOD AND SEMICONDUCTOR MANUFACTURING APPARATUS

This application is the National Phase of PCT/JP2005/017260, filed Sep. 20, 2005, the disclosure of which is hereby incorporated by reference in its entirety.

TECHNICAL FIELD

This invention relates to a method of quickly carrying out hydrogen termination treatment of a semiconductor surface and further relates to an apparatus for carrying out such hydrogen termination treatment and a product such as a semiconductor device obtained by carrying out such hydrogen termination treatment.

BACKGROUND ART

Figure 1:
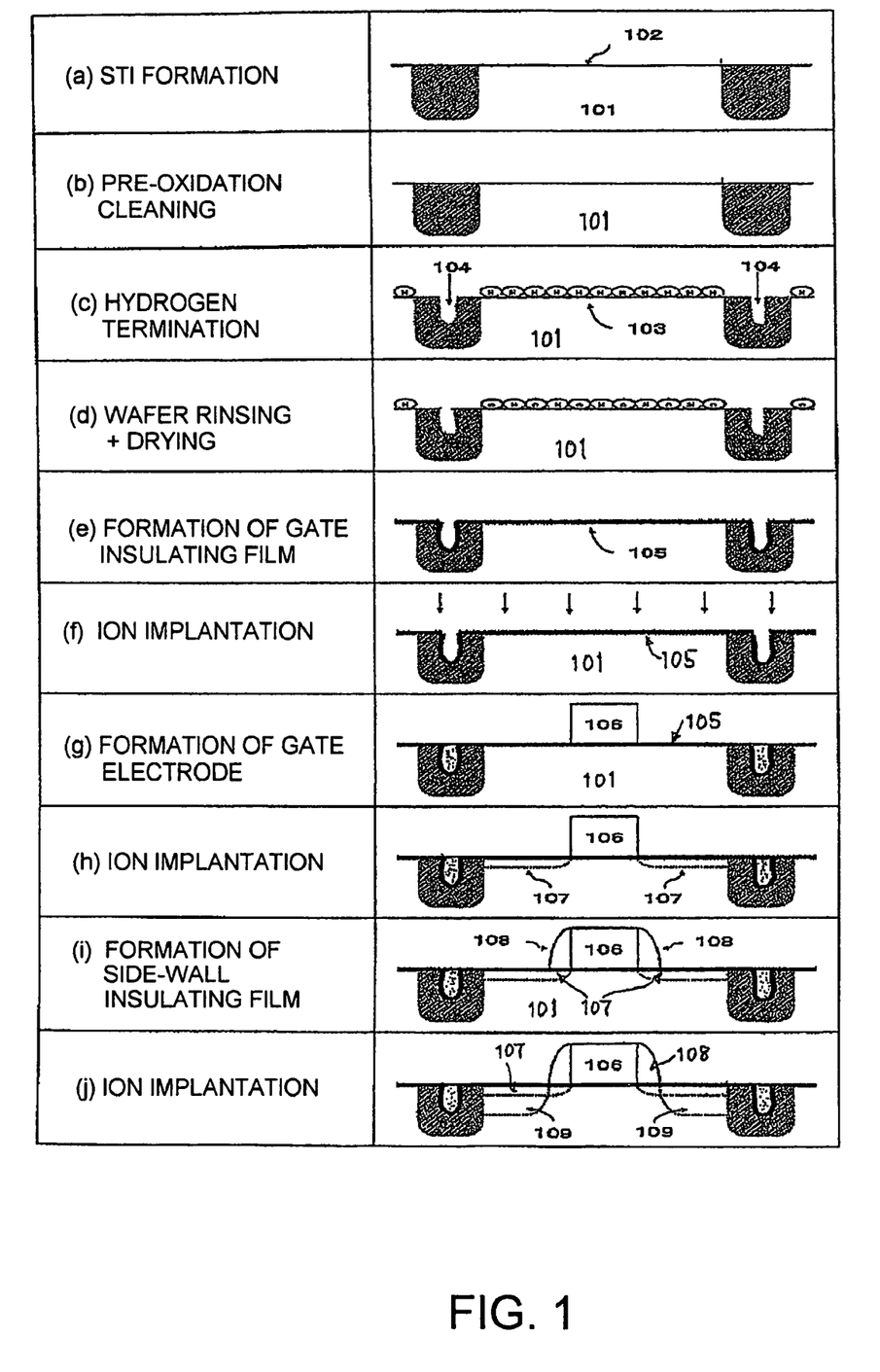

Manufacturing processes of a field-effect transistor constituting an integrated circuit formed in a semiconductor region will be described with reference to FIG. 1, using an LDD (Lightly Doped Drain)-structure n-type field-effect transistor as an example.

At first, element isolation is carried out, for example, by an STI (Shallow Trench Isolation) method, thereby forming an element region 102 on the surface of a p-type (110) surface silicon 101 serving as a semiconductor substrate (FIG. 1(a)).

Pre-oxidation cleaning such as RCA cleaning is applied to the element region 102 (FIG. 1(b)) to remove organic compounds, particles, and metal impurities and, thereafter, dilute hydrofluoric acid treatment and then rinsing with pure water are performed to hydrogen-terminate 103 the element region 102 (FIG. 1(c)). After drying the wafer (FIG. 1(d)), a gate insulating film ($SiO_2$) 105 is formed (FIG. 1(e)).

Then, boron is ion-implanted over the entire surface of the silicon 101 for controlling the threshold voltage (FIG. 1(f)).

Then, a polycrystalline silicon film is deposited over the entire surface of the silicon 101 and then patterned, thereby forming a gate electrode 106 of polycrystalline silicon on the gate insulating film 105 in the element region 102 (FIG. 1(g)).

Then, phosphorus is ion-implanted at a low concentration, thereby forming n⁻ source and drain regions 107 that serve to relax high electric fields (FIG. 1(h)).

Then, a silicon oxide film ($SiO_2$) is deposited over the entire surface of the silicon 101 by a CVD method or the like so as to cover the gate electrode 106 and then anisotropic etching is performed, thereby forming a side-wall insulating film 108 on the side walls of the gate electrode 106 (FIG. 1(i)).

Thereafter, n-type impurities such as arsenic are ion-implanted at a high concentration, thereby forming n⁺ source and drain regions 109 (FIG. 1(j)).

In Patent Document 1, the present inventors have previously proposed a semiconductor device manufacturing method that uses $H_2O$ added with hydrogen or deuterium and applies high-frequency vibration when cleaning a semiconductor surface, thereby performing hydrogen termination thereof.

Herein, when forming the field-effect transistor as described above on the Si (110) surface or Si (111) surface or further on polycrystalline Si, it takes time to perform the dilute hydrofluoric acid treatment to achieve the hydrogen termination 103 in FIG. 1(d). Speaking of the time required for stripping a chemical $SiO_2$, formed in the RCA cleaning, by the dilute hydrofluoric acid treatment to achieve the hydrogen termination, it can be realized by immersion in a 0.5 wt % dilute hydrofluoric acid solution for 1 minute or so in the case of the Si (100) surface. However, in the case of the Si (110) surface, the Si (111) surface, or further the polycrystalline Si, it is necessary to immerse it in a 0.5 wt % dilute hydrofluoric acid solution for 10 minutes or more. In order to shorten the hydrogen termination time to about 3 minutes, it is necessary to increase the concentration of the dilute hydrofluoric acid by approximately 10 wt %. In this case, a silicon oxide film used in the STI is etched particularly at its embedded central portion, so that a void 104 is formed as shown in FIG. 1(c). In the later gate electrode forming process (FIG. 1(g)), the polycrystalline silicon is embedded in the void 104. When the integrated circuit is completed, this polycrystalline silicon embedded in the void 104 causes deterioration of withstand voltage between the elements and further causes occurrence of wiring shorts.

In three-dimensional transistors such as Fin-FETs, there is a case where one transistor is formed on both Si (100) and (110) surfaces.

Figure 2:
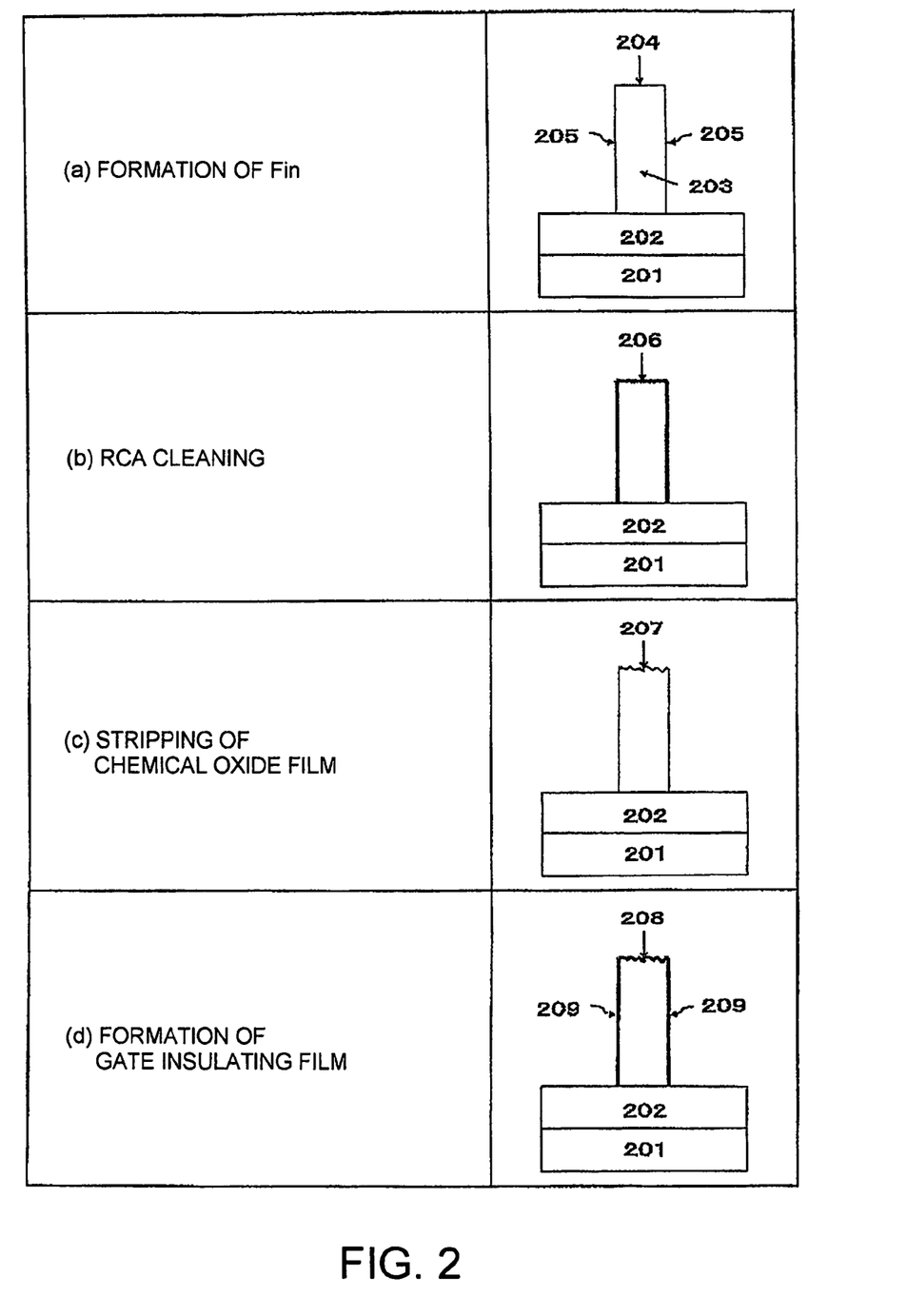

FIG. 2 shows states before and after formation of a gate insulating film of a Fin-FET. FIG. 2(a) is a section of an element region as seen in a direction from source to drain. $SiO2$ 202 is formed on a Si substrate 201 and a Fin 203 is formed thereon. The element region comprises a Si (100) surface 204 and Si (110) surfaces 205. After performing acid cleaning ($HCl/H_2O_2$ cleaning) in RCA cleaning, a chemical oxide film 206 is formed (FIG. 2(b)). Thereafter, 0.5 wt % dilute hydrofluoric acid treatment is carried out to strip the chemical oxide film 206, but it takes about 10 minutes to hydrogen-terminate the Si (110) surfaces 205. By the treatment for about 10 minutes, etching of an STI silicon oxide film proceeds like in the case of FIG. 1, thus causing deterioration of withstand voltage between elements and wiring shorts. Hydrogen termination of the Si (100) surface 204 is completed in 1 minute or so, but, thereafter, the Si (100) surface 204 is overetched for 9 minutes until the hydrogen termination of the Si (110) surfaces 205 is accomplished. This causes a bad effect that the Si (100) surface is roughened (207 in FIG. 2(c)). As a result, the electric reliability of a gate insulating film 208 formed on the Si (100) surface 204 is inferior to that of a gate insulating film 209 formed on the Si (110) surfaces 205 (FIG. 2(d)).

On the other hand, Patent Document 1 discloses the hydrogen termination in the cleaning process, but gives no explanation about the hydrogen termination when stripping the chemical oxide film by carrying out the dilute hydrofluoric acid treatment.

Patent Document 1: Japanese Unexamined Patent Application Publication (JP-A) No. 2005-51141

DISCLOSURE OF THE INVENTION

Problem to be Solved by the Invention

This invention has been made under these circumstances and has an object to elucidate a cause of the fact that a Si (111) surface, a Si (110) surface, a polycrystalline silicon surface, and an amorphous silicon surface are not liable to be hydrogen-terminated as compared with a Si (100) surface, thereby providing a more efficient hydrogen termination method, and further has an object to provide a method and apparatus for manufacturing an electrically reliable semiconductor device by realizing the hydrogen termination.

Means for Solving the Problem

This invention is characterized by increasing the speed of hydrogen termination by adding an oxidant to a solution containing dilute hydrofluoric acid.

Figure 3:
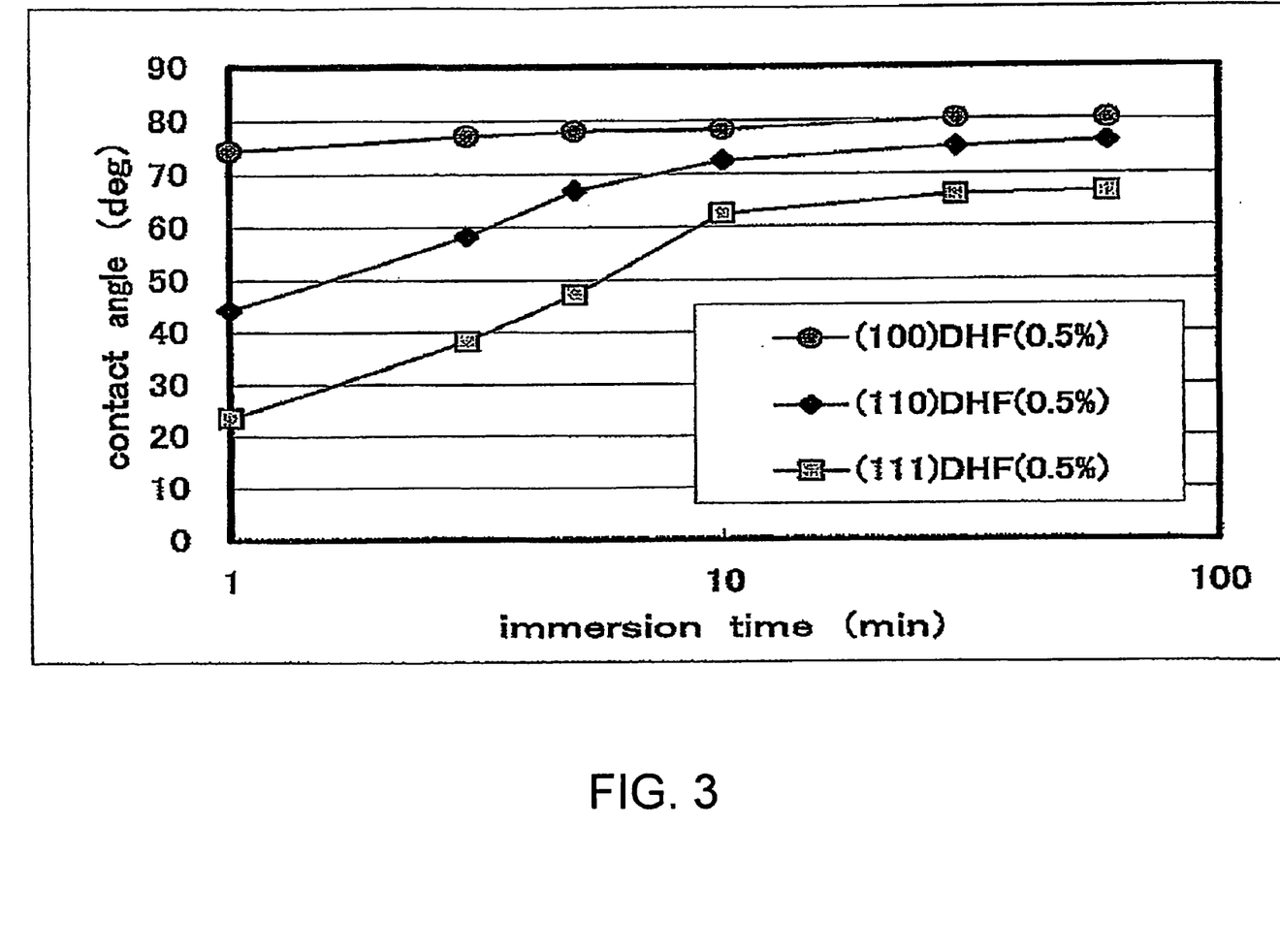
FIG. 3 is a graph for explaining the DHF solution immersion time dependence (difference due to surface orientation) of contact angle.

FIG. 3 shows the 0.5 wt % DHF immersion time dependence of contact angle of pure water dropped on a Si (100) surface, a Si (110) surface, and a Si (111) surface. The axis of abscissas represents a time of immersion of Si in a DHF solution. The axis of ordinates represents a contact angle measured within 30 seconds after carrying out pure-water rinsing for 30 seconds immediately after DHF treatment and then dropping pure water on a predetermined surface after 2 minutes from the pure-water rinsing. The reason for performing the strict time management in the contact angle measurement is to avoid the influence of organic compounds or a natural oxide film that adhere to or grows on a wafer due to clean-room exposure. From FIG. 3, the Si (100) surface hardly depends on the DHF immersion time, wherein, after the treatment for 1 minute, the contact angle is 75° and thus the hydrophobicity is realized. On the other hand, in the case of the Si (110) surface and the Si (111) surface, sufficient hydrophobicity cannot be realized when the immersion time is short. The contact angle increases as the DHF immersion time becomes longer and, after the treatment for about 10 minutes, the contact angle is saturated and the hydrophobicity can be realized. From the above, it can be said that the Si (110) surface and the Si (111) surface are surfaces with difficulty in realizing the hydrophobicity as compared with the Si (100) surface. Likewise, polycrystalline silicon and amorphous silicon are surfaces also having difficulty in realizing the hydrophobicity.

The contact angle of pure water on the surface is considered to represent the surface termination state of the Si surface. An increase in hydrophobicity represents an increase in Si—H termination, while, a hydrophilic tendency represents an increase in ratio of Si—OH, Si—F, or Si—O bonds. As a result of examining the surfaces after the DHF treatment using an XPS, ellipso, and FTIR-ATR method, no Si—F or Si—O bonds were observed and therefore it was judged that the main cause of increasing the hydrophilic tendency was Si—OH bonds. An etching species of $SiO_2$ is $HF_2^-$ and it is conjectured that $SiO_2$ is effectively removed by this $HF_2^-$ and thus sites terminated with Si—O hardly remain on the Si surfaces.

The Si (110) surface being not liable to be hydrophobic represents that Si—OH bonds are easily formed thereon. This can be easily inferred by the fact that the etching rate of the Si (110) surface is high in a KOH solution immersion test. $Si(OH)_4$ is formed by OH-ion attack to Si—Si bond weak portions and Si is dissolved into the solution. As a result, in the case of the Si (110) surface, the etching proceeds so that Si (110) terraces are expanded or chains of Si (111) facets in a <-110> direction are formed. Monohydride is formed as a result of the progress of the etching. It is considered that the monohydride on the Si (110) surface exhibits relatively stable termination. Monohydride on the Si (111) surface is the same. Until the stable monohydride structure is formed, Si—OH bonds are easily formed in weak Si—Si bonds on the Si (110) surface or the Si (111) surface and thus the surface tends to be Si—OH bonded.

Herein, referring to FIG. 4, a description will be given of a mechanism in which Si—H bonds are formed. There are two paths when roughly classified. One path proceeds from Si—OH bonds to Si—F bonds and further to Si—H bonds. With respect to the flow from the Si—OH bonds to the Si—F bonds, O in Si—O—H has a large electronegativity and thus is charged negative. Then, H in HF molecules present in a solution is attracted to O, while F in the HF molecules is bonded to Si in the Si—O—H bonds. With respect to the Si—F bonds, F is charged negative due to its large electronegativity, while Si is charged positive. Then, F in HF molecules present in the solution is bonded to Si, while H is bonded to Si forming backbonds of the Si—F bonds. Si bonded to F is desorbed into the water in the form of $SiF_4$. This is conjectured to be the dominant mechanism of hydrogen termination on the Si (100) surface or the like.

The other path is such that formation of Si—OH bonds proceeds and Si on the surface is dissolved into water in the form of $Si(OH)_4$, while remaining Si forms Si—H bonds. This is conjectured to be the dominant mechanism in the case of the Si (110) surface or the Si (111) surface. In the case of the Si (110) surface or the Si (111) surface, it is considered that the Si—OH terminals are easily formed, but it takes time to form $Si(OH)_4$ and thus the hydrogen termination speed becomes slow.

As such a surface orientation where the hydrogen termination speed is slow, there is cited a surface where a <111> axis perpendicular to the Si (111) surface is inclined in a <11-2> or <-1-12> axis direction. For example, it is a Si (111) surface, (221) surface, (331) surface, (551) surface, (110) surface, (335) surface, (112) surface, (113) surface, (115) surface, (117) surface, or the like. Although a Si (001) surface can be cited as a surface where the <111> axis perpendicular to the Si (111) surface is inclined in the <-1-12> axis direction, this surface is predominantly terminated with dihydride and thus the hydrogen termination speed is fast. However, if an off-angle is formed even a little, Si (111) facets, i.e. monohydride portions, appear, thus making the hydrogen termination difficult to achieve.

In the case of silicon having a surface substantially with the (110) surface orientation, the Si—OH termination tends to proceed and thus the hydrogen termination is difficult to achieve. Crystallographically, it is a surface facing in a direction substantially equivalent to the (110) surface orientation and includes a (551) surface, a (311) surface, a (221) surface, a (553) surface, a (335) surface, a (112) surface, a (113) surface, a (115) surface, a (117) surface, or the like.

From FIG. 2 in Sensors and Actuators 73 (1999) P122-130 reported by Kazuo Sato et al., it is seen that when a (110) surface is subjected to alkali etching, there is obtained a surface shape with stripes running in a <-110> direction. As a region adapted to obtain the same surface shape as the (110) surface, there is cited a surface offset by 0 to 12° in a <100> direction, such as, for example, a (551) surface offset by 8°. The same surface shape is obtained with respect to a surface offset by up to 1° in a <-110> direction. Also in the case of the surface orientations exhibiting the same surface roughness behavior as the (110) surface in the above FIG. 2, the Si—OH termination tends to proceed and thus the hydrogen termination is difficult to achieve.

Further, according to Phys. Rev., B4, 1950 (1971) reported by T. Sato et al., it is possible to know a surface adapted to obtain the same carrier electron mobility as a (110) surface. The surface with the same mobility can be inferred to be a surface where the surface morphology or the hydrogen termination state is substantially the same as that of the (110) surface. Accordingly, it can be said that a surface offset by 0 to 35° in a <-110> direction, such as, for example, a (331) surface, a (221) surface, a (332) surface, or a (111) surface, has the same surface state as the (110) surface. Further, even by using a surface offset by 0 to 12° in a <1-10> direction, such as, for example, a (320) surface, it can be said to be the same surface state as that of the (110) surface. Also in the case of the above surfaces and their neighboring surfaces, the Si—OH termination tends to proceed and thus the hydrogen termination is difficult to achieve.

Figure 4:
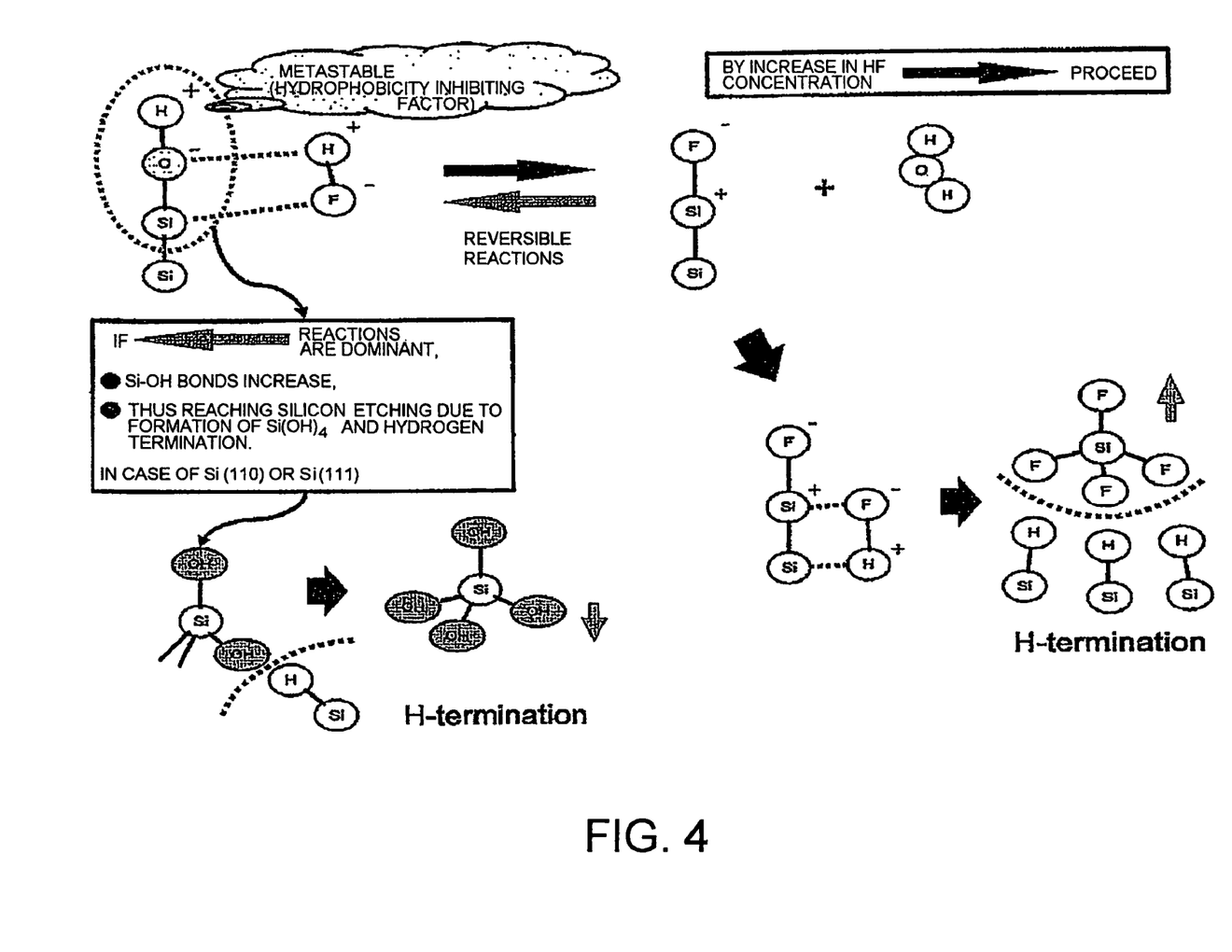
FIG. 4 is an exemplary diagram for explaining a Si—H bond formation mechanism.
Figure 5:
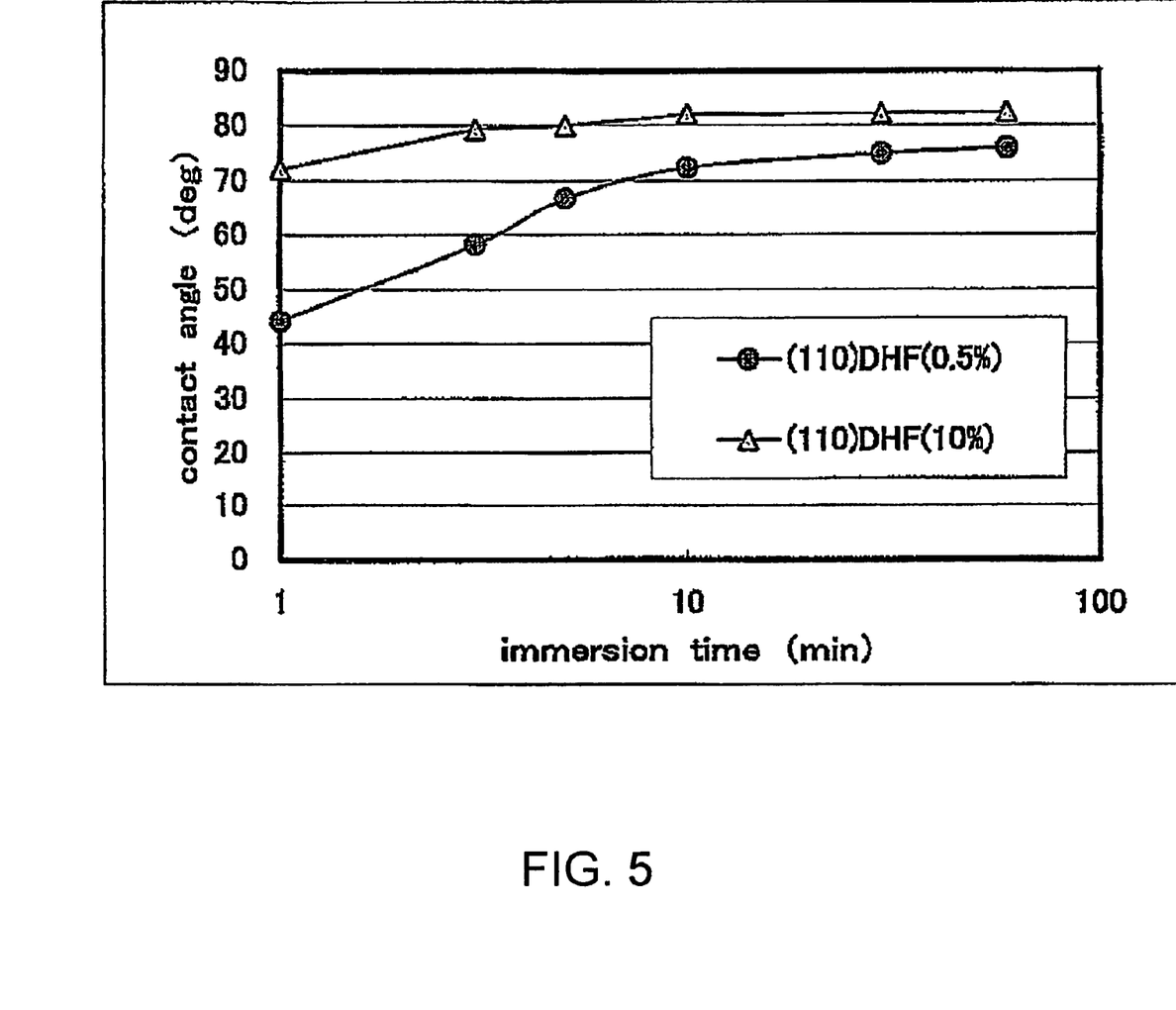
FIG. 5 is a graph for explaining the DHF solution immersion time dependence (difference due to DHF concentration) of contact angle.

As a technique of increasing the speed of hydrogen termination of the Si (110) surface or the Si (111) surface, an experiment was performed where the concentration of HF was raised for increasing the ratio of reactions of forming Si—H terminals from the Si—F reactions in FIG. 4. The results are shown in FIG. 5. From FIG. 5, the hydrophobicity of the Si (110) surface is realized after an immersion time of about 3 minutes by raising the DHF concentration from 0.5 wt % to 10 wt %. However, the etching rate of $SiO_2$ is increased to 20 times by raising the concentration from 0.5 wt % to 10 wt %. This also increases damage to an element isolation oxide film for STI or the like, a side-wall insulating film of a gate, and a PMD (Pre-Metal Dielectric) film.

Figure 6:
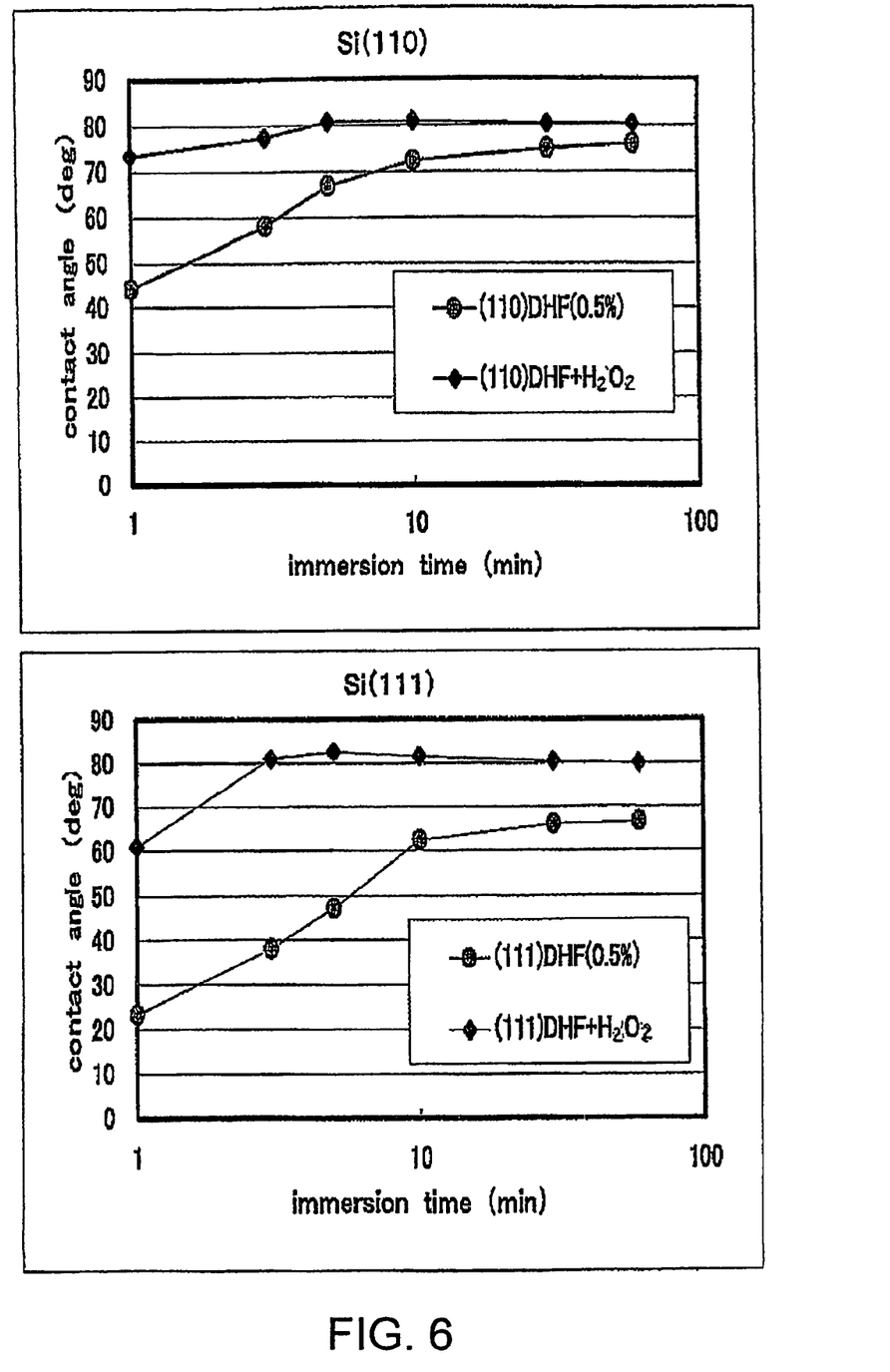
FIG. 6 is graphs each for explaining the DHF solution or $H_2O_2$-added DHF solution immersion time dependence (Si (110) surface, Si (111) surface) of contact angle.

As a technique of hydrogen-terminating, in a short time, the Si (110) surface or the Si (111) surface at a DHF concentration of about 0.5 wt %, i.e. without raising the DHF concentration, hydrogen peroxide $H_2O_2$ was added in an amount of 0.5 wt % as an oxidant into a solution. The results are shown in FIG. 6. In the case of both the Si (110) surface and the Si (111) surface, sufficient hydrophobicity is achieved after immersion for about 3 minutes. Even after immersion for about 1 minute, there is obtained a contact angle equivalent to that obtained after DHF immersion for a long period of time. The etching rate of $SiO_2$ in the solution added with $H_2O_2$ in the amount of 0.5 wt % was examined.

Figure 7:
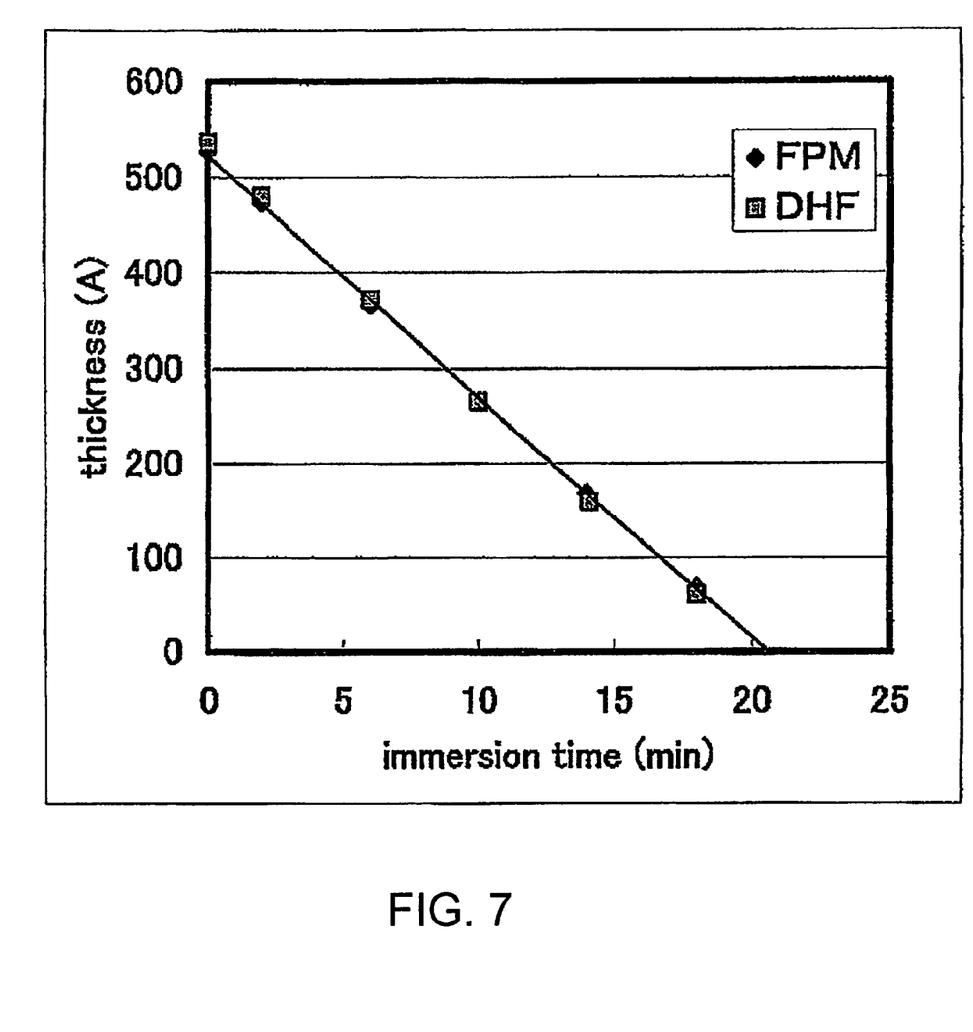
FIG. 7 is a graph showing $SiO_2$ etching rates of a DHF solution and a DHF solution added with $H_2O_2$.

In FIG. 7, the axis of ordinates represents the thickness of $SiO_2$ and the axis of abscissas represents the immersion time in the solution. The slope of characteristics represents the etching rate of $SiO_2$. No difference is observed between the etching rates of $SiO_2$ in DHF alone and DHF added with $H_2O_2$. From this, it is seen that even if the DHF solution added with $H_2O_2$ is used, damage to the element isolation oxide film, the gate side-wall insulating film, and the PMD film does not increase. With respect to the adding ratio of $H_2O_2$, the same results are obtained when DHF:$H_2O_2$=1:0.1 to 1:100, but, if the adding ratio of $H_2O_2$ is excessively lowered, there is a possibility that the effect of removal of metal impurities is reduced.

The same results were obtained even when use was made of a solution obtained by adding DHF into pure water added with $O_3$ in an amount of 10 ppm as an oxidant. Note that 10 ppm is a ratio of the weight of $O_3$ in the weight of the water. With respect to the $O_3$ concentration in the pure water, the same results were observed even by changing it from 0.001 ppm to 100 ppm.

Figure 8:
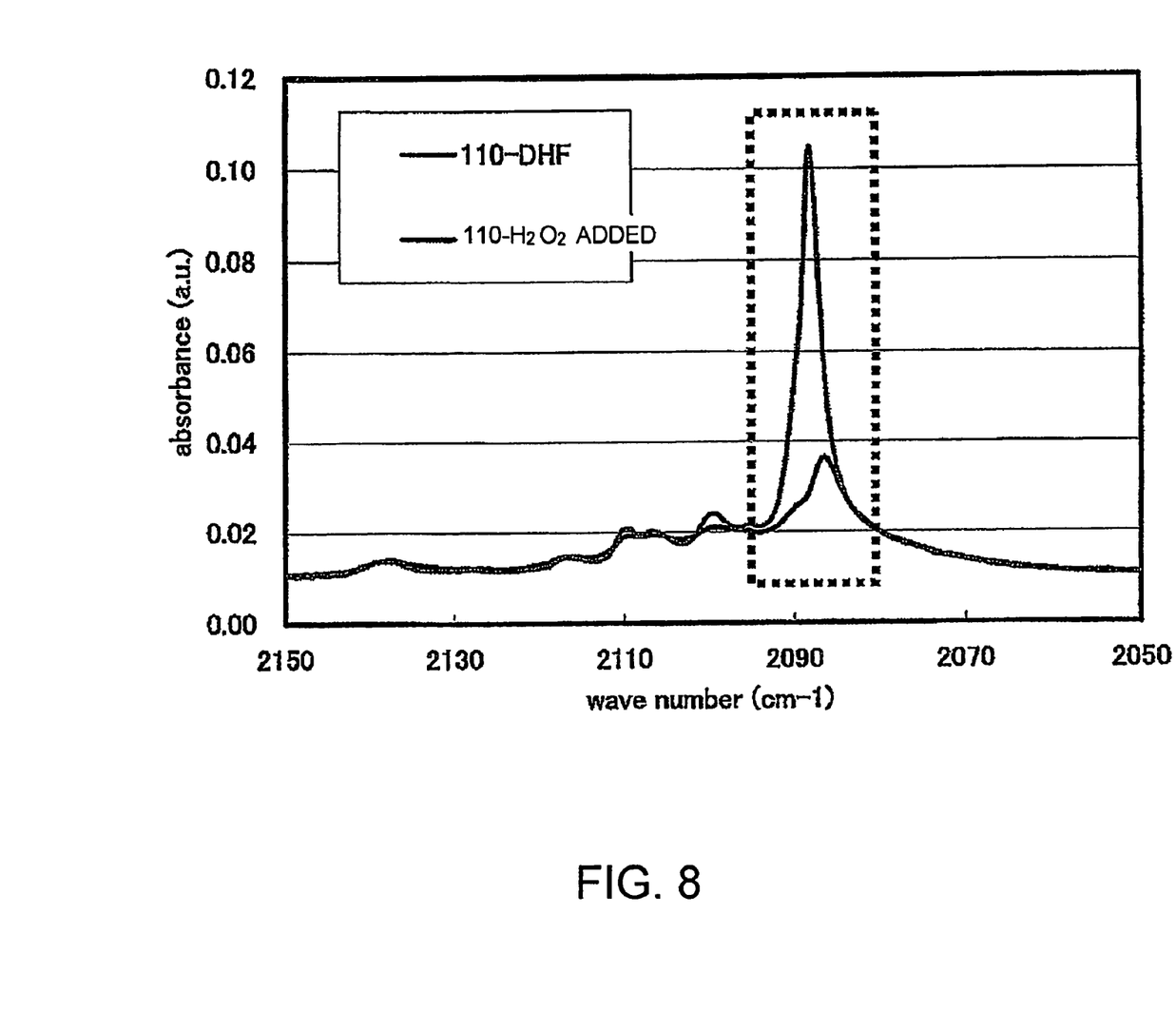
FIG. 8 is a graph showing the spectra of Si—H stretch mode peaks according to the FTIR-ATR measurement.
Figure 9:
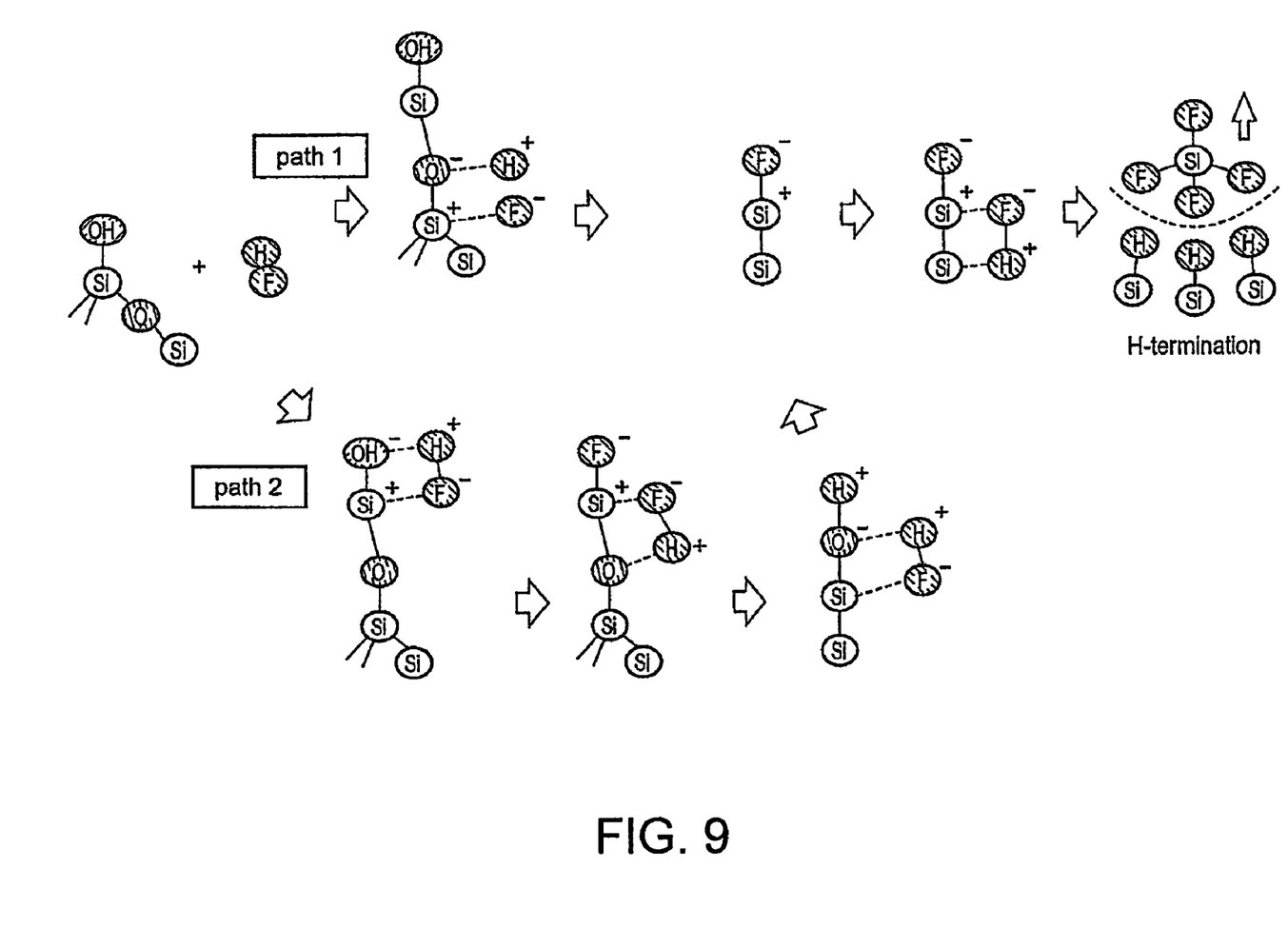
FIG. 9 is an exemplary diagram for explaining a mechanism in which Si—OH bonds are transformed into Si—H bonds.

Then, it will be inferred why the hydrogen termination is quickened by adding the oxidant. FIG. 8 shows Si—H stretch mode peaks measured by an FTIR-ATR method. The two peaks are those after treatment with 0.5 wt % DHF and after treatment with a solution in which 0.5 wt % $H_2O_2$ is added to 0.5% DHF, respectively. Samples were subjected to the respective treatments for 3 minutes, pure-water rinsing for 30 seconds, and $N_2$ drying for 1 minute, and then subjected to the FTIR measurement. The peak near 2089 $cm^{-1}$ increases in the case of the $H_2O_2$-added treatment as compared with the DHF treatment. This is the Si—H monohydride termination peak. In the case of DHF, the termination is carried out with OH substituting for monohydride portions, while, in the case of $H_2O_2$ added, it is seen that OH is removed and the Si—H termination is enhanced. This is conjectured to be resulted from the fact that, as shown in FIG. 9, O is inserted into backbonds of Si—OH to form Si—O—Si bonds, then reactions proceed to formation of Si—F bonds and then to formation of Si—H bonds. In FIG. 9, it is considered that the reactions of path 1 are dominant. It is known that, in Si—OH bonds, Si backbonds can be easily oxidized. Even if exposed to a clean-room atmosphere, insertion reactions of oxygen into backbonds are observed in several hours. It is considered that the oxidation of weak backbonds of Si—OH is accelerated by the addition of $H_2O_2$ into the solution to thereby quicken the hydrogen termination.

As described above, it has first been clarified this time that, by adding an oxidant to an HF-based solution, Si—OH terminated portions are quickly oxidized and removed to thereby achieve Si—H termination. Since the etching rate of a silicon oxide film is unchanged before and after the addition of the oxidant, damage to a silicon oxide film for element isolation such as STI, a side-wall film of a gate, and a PMD film is also as conventional. It becomes possible to hydrogen-terminate, like a Si (100) surface, a Si (111) surface, a Si (110) surface, and a polycrystalline silicon surface that are not liable to be hydrogen-terminated as compared with the Si (100) surface. This improves the reliability of transistors formed on various surface orientations and, further, largely contributes to a reduction in resistance at contact portions.

Effect of the Invention

According to this invention, using a solution containing $HF_2^-$ ions and an oxidant, it is possible to increase the speed of hydrogen termination of a silicon surface having a portion hydrogen-terminated with monohydride, such as a Si (100) surface, a Si (110) surface, a polycrystalline silicon surface, or an amorphous silicon surface, thereby reliably achieving the hydrogen termination.

Since this technique can shorten a treatment time with $HF_2^-$ ions, it is possible to suppress etching of an STI silicon oxide film and also possible to suppress deterioration of withstand voltage between elements, wiring shorts, and damage to a side-wall insulating film and a PMD film. Further, it becomes possible to form high-quality gate insulating films on various surface orientations. Further, it largely contributes to a reduction in contact resistance at contact portions of salicide or the like.

This technique is applicable not only to a gate insulating film forming process and a salicide-forming metal film forming process, but also to a barrier metal forming process, a process of embedding a plug material into a contact hole, and so on.

BRIEF DESCRIPTION OF THE DRAWINGS

FIG. 1(a) to FIG. 1(j) are diagrams for explaining, in sequence, processes of manufacturing a field-effect transistor using a conventional technique.

FIG. 2(a) to FIG. 2(d) are diagrams for explaining Fin-FET gate insulating film forming processes using a conventional technique.

FIG. 11(a) to FIG. 11(d) are diagrams for explaining Fin-FET gate insulating film forming processes according to a second embodiment of this invention.

DESCRIPTION OF SYMBOLS 1001 p-type (110) silicon wafer
1002 element region
1003 hydrogen termination
1004 gate insulating film
1005 gate electrode
1006 n⁻ source and drain regions
1007 side-wall insulating film
1008 n⁺ source and drain regions
1009 source and drain region surfaces
1010 hydrogen termination
1011 metal thin film
1012 salicide region
1013 barrier-SiN
1014 BPSG

BEST MODE FOR CARRYING OUT THE INVENTION

A description will be given based on the following embodiments.

Embodiment 1

Figure 10:
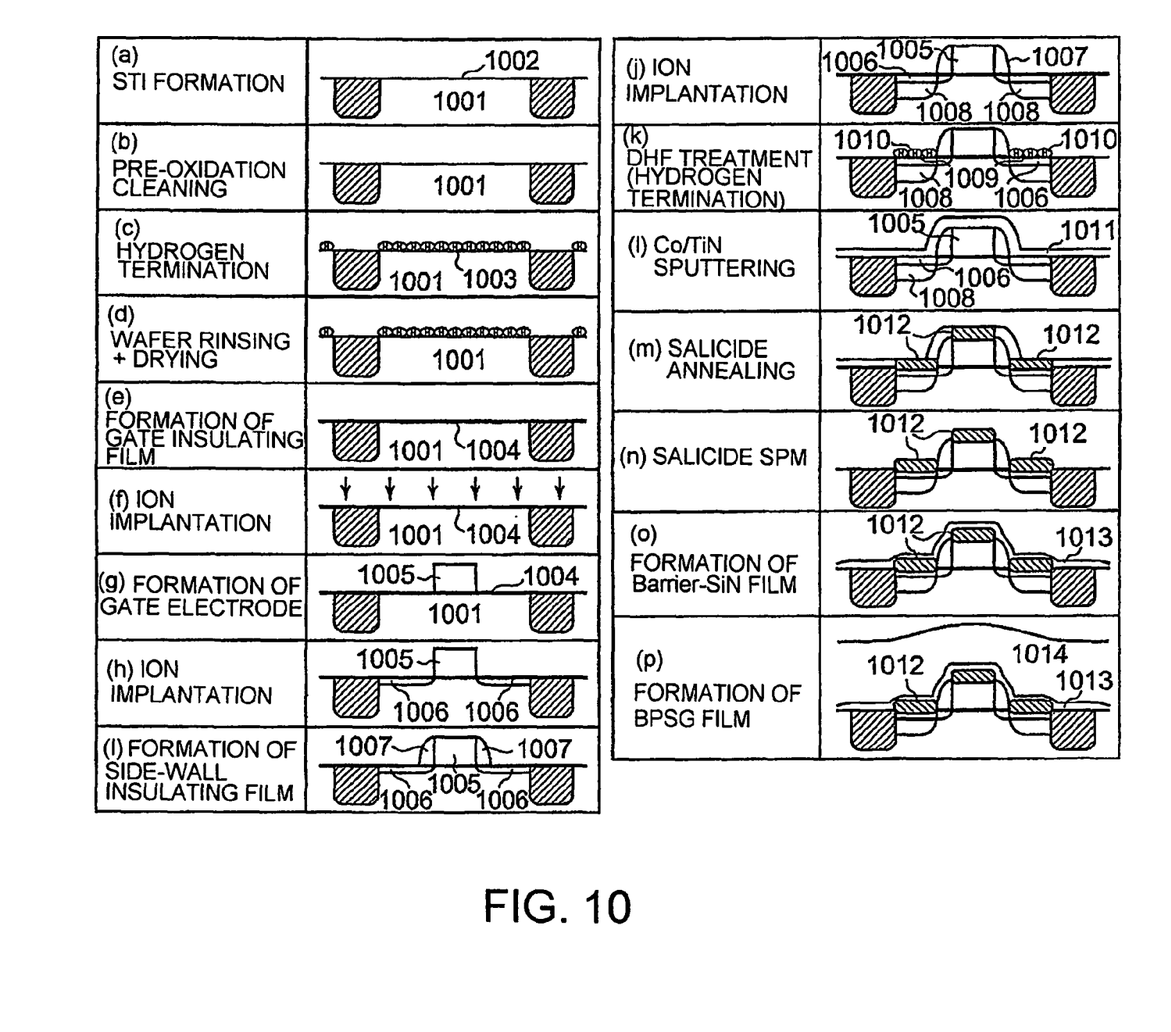
FIG. 10(a) to FIG. 10(p) are diagrams for explaining, in sequence, a manufacturing method according to a first embodiment of this invention.

As the first embodiment, manufacturing processes of a field-effect transistor constituting an integrated circuit formed in a semiconductor region will be described using an LDD (Lightly Doped Drain)-structure n-type field-effect transistor as an example. FIG. 10 shows the transistor flow.

Element isolation is carried out, for example, by an STI (Shallow Trench Isolation) method, thereby forming an element region 1002 including source, drain, and channel regions on the surface of a p-type (110) silicon wafer 1001 (FIG. 10(a)). Pre-oxidation cleaning such as RCA cleaning is applied to the element region 1002 (FIG. 10(b)) to remove organic compounds, particles, and metal impurities and, thereafter, treatment is carried out using a solution in which $H_2O_2$ is added in an amount of 0.5 wt % to 0.5 wt % hydrofluoric acid. The etching time in this event is 1 minute. Subsequently, rinsing with pure water is performed to hydrogen-terminate 1003 the element region 1002 (FIG. 10(c)).

An etching species when etching $SiO_2$ with an HF-based chemical is $HF_2^-$, wherein a chemical oxide film formed in the RCA cleaning is substantially etched off in about 30 seconds and there is almost no site terminated with Si—O. The surface is etched at Si—OH terminated portions and finally shifted to Si—H, which can be realized with overetching for about 30 seconds. This makes it possible to suppress etching of an STI silicon oxide film used for element isolation and thus no occurrence of void is observed.

The HF-based chemical may be a DHF solution or BHF (buffered hydrofluoric acid: mixed solution of DHF and $NH_4F$) or may be a solution containing at least one of DHF and $NH_4F$. An oxidant added to the solution may be ozone $O_3$ instead of $H_2O_2$. Alternatively, it may be an organic oxidant.

After drying the wafer (FIG. 10(d)), a gate oxide film forming apparatus is used to oxidize the silicon surface of the element region, thereby forming a 5 nm gate insulating film ($SiO_2$) 1004 (FIG. 10(e)). It is sufficient that a silicon oxide film formed in this invention is present at least a portion being in contact with silicon and, therefore, use may be made of an insulating film formed, on the silicon oxide film, with one or more layers of different kinds of materials, such as an oxide, a nitride, an oxynitride, a silicate, and the like of an alkaline earth metal, a rare earth metal, and a transition metal. Instead of the silicon oxide film, use may be made of a single layer or a laminated structure of an oxide, a nitride, an oxynitride, a silicate, and the like of an alkaline earth metal, a rare earth metal, and a transition metal. Further, use may be made of a film including one or more of a silicon oxide film, a silicon nitride film, and a silicon oxynitride film.

Then, boron is ion-implanted over the entire surface of the silicon 1001 for controlling the threshold voltage (FIG. 10(f)).

Then, a polycrystalline silicon film is deposited over the entire surface of the silicon 1001 and then patterned, thereby forming a polycrystalline silicon electrode 1005 as a gate electrode on the gate insulating film 1004 in the element region 1002 (FIG. 10(g)).

Then, phosphorus is ion-implanted at a low concentration, thereby forming n⁻ source and drain regions 1006 that serve to relax high electric fields (FIG. 10(h)).

Then, a silicon oxide film ($SiO_2$) is deposited over the entire surface of the silicon 1001 by a CVD method or the like so as to cover the gate electrode 1005 and then anisotropic etching is performed, thereby forming a side-wall insulating film 1007 on the side walls of the gate electrode 1005 (FIG. 10(i)).

Thereafter, n-type impurities such as arsenic are ion-implanted at a high concentration, thereby forming n⁺ source and drain regions 1008 (FIG. 10(j)).

Then, the flow shifts to a process of salicide formation. $SiO_2$ with the thickness of 5 nm is formed as the gate insulating film on source and drain region surfaces 1009 and thus stripping treatment is performed using a solution in which 0.5 wt % $H_2O_2$ is added to 0.5 wt % hydrofluoric acid. The etching time in this event is 2 minutes. Subsequently, rinsing with pure water is performed to hydrogen-terminate 1010 the source and drain region surfaces 1009 (FIG. 10(k)). By etching the silicon surface in the source and drain regions in a short time and reliably hydrogen-terminating it, it is possible to prevent an increase in resistance value of cobalt silicide formed later, thereby realizing stable low-resistance contacts. Further, by shortening the etching time, it is possible to suppress as much as possible etching of the STI silicon oxide film and the side-wall insulating film.

An HF-based chemical may be a DHF solution or BHF (buffered hydrofluoric acid: mixed solution of DHF and $NH_4F$) or may be a solution containing at least one of DHF and $NH_4F$. An oxidant added to the solution may be ozone instead of $H_2O_2$. Alternatively, it may be an organic oxidant.

Thereafter, Co sputtering and then Ti/TiN sputtering are carried out, thereby forming a metal thin film 1011 (FIG. 10(l)).

Salicide annealing is carried out to form cobalt silicide regions 1012 (FIG. 10(m)) and, through a process of salicide SPM (FIG. 10(n)), salicide regions 1012 are formed.

Then, after formation of a barrier-SiN film 1013 (FIG. 10(o)), a BPSG film 1014 being a PMD film is formed (FIG. 10(p)).

In this embodiment, the p-type (110) silicon wafer is used. However, it is also applicable to increase the speed of hydrogen termination of a Si (111) surface or a polycrystalline silicon surface. Transistor TFTs formed on polycrystalline silicon are used as a liquid crystal driver and it is possible to enhance the reliability thereof by the use of this technique.

In this embodiment, the etching of the STI oxide film is suppressed by performing the treatment using the solution in which 0.5 wt % $H_2O_2$ is added to 0.5 wt % hydrofluoric acid before the gate insulating film formation and before the Co/TiN sputtering. Owing to this, no void is formed in the STI and thus the embedding of the polycrystalline silicon is not observed. Therefore, it becomes possible to prevent a reduction in yield due to deterioration of withstand voltage between elements or wiring shorts.

Further, the etching of the side-wall insulating film is suppressed by performing the treatment using the solution in which 0.5 wt % $H_2O_2$ is added to 0.5 wt % hydrofluoric acid before the Co/TiN film formation. Owing to this, it becomes possible to suppress a reduction in yield due to BL (bit line) shorts, WL (word line) shots, or the like.

Embodiment 2

Next, as the second embodiment, there are shown states before and after formation of a gate insulating film of a Fin-FET.

Figure 11:
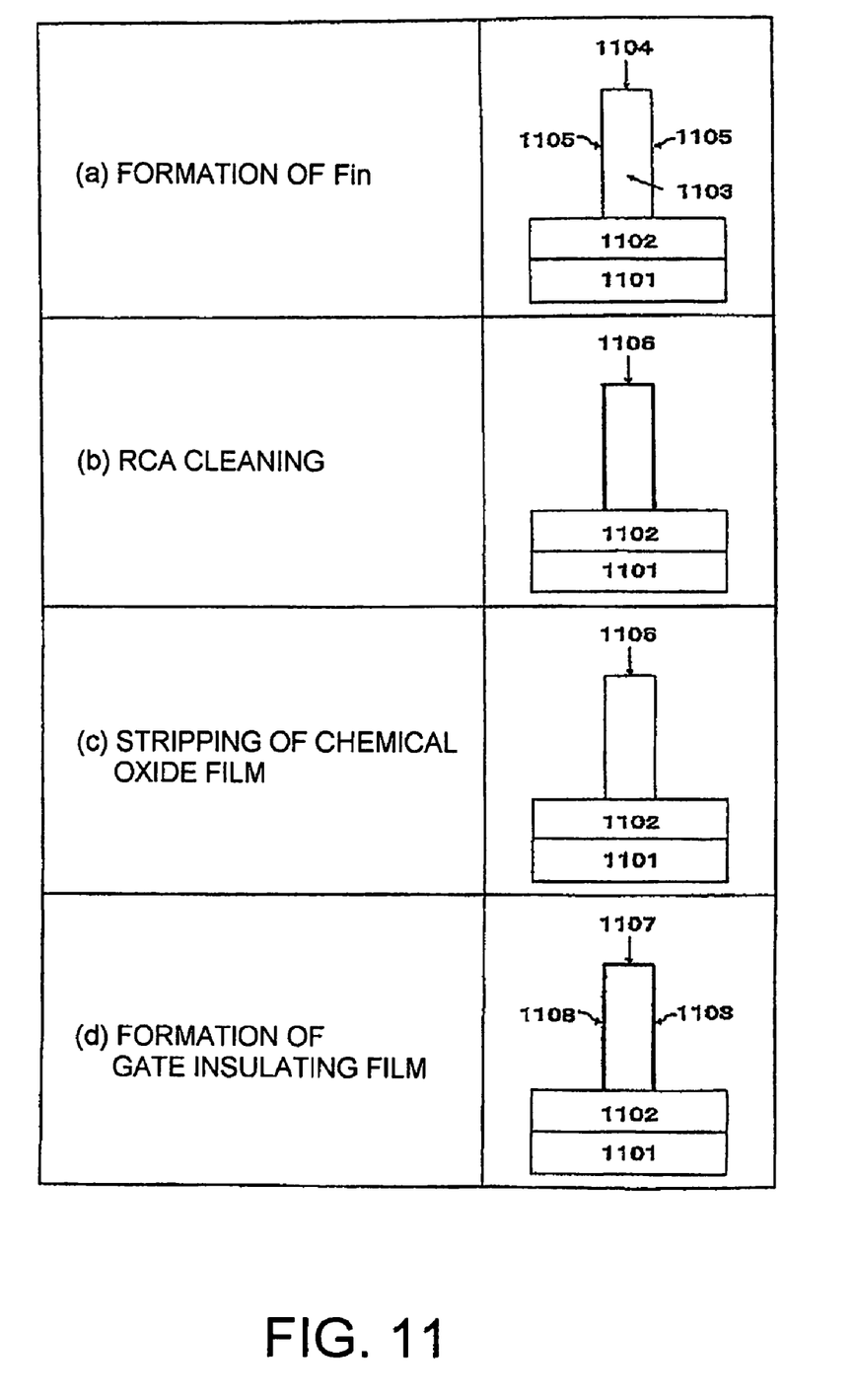

FIG. 11(a) is a section of an element region as seen in a direction from source to drain. SiO2 1102 is formed on a Si substrate 1101 and a Fin 1103 is formed thereon. The element region comprises a Si (100) surface 1104 and Si (110) surfaces 1105. After performing acid cleaning (HCl/$H_2O_2$ cleaning) in RCA cleaning, a chemical oxide film 1106 is formed (FIG. 11(b)). Thereafter, treatment is carried out using a solution in which 0.5 wt % $H_2O_2$ is added to 0.5 wt % dilute hydrofluoric acid, thereby stripping the chemical oxide film 1106. The stripping time is 1 minute. Using this solution, the chemical oxide film 1106 is stripped in about 30 seconds regardless of the surface orientation and, thereafter, hydrogen termination is achieved with overetching for about 30 seconds. Owing to the short-time etching for about 1 minute, etching of an STI silicon oxide film is suppressed. Further, since the overetching time is also short, roughening of the Si (100) surface 1004 is also suppressed (FIG. 11(c)). Then, after performing rinsing treatment and drying treatment, gate insulating films 1107 and 1108 are formed on the Si (100) and (110) surfaces 1104 and 1105, respectively (FIG. 11(d)). As compared with the case of FIG. 2 being the conventional technique, the roughening of the Si (100) surface 1004 is prevented and thus the difference in film quality between the gate insulating films 1107 and 1108 is small. Consequently, the excellent and uniform gate insulating film can be formed regardless of the surface orientation, so that an improvement in Fin transistor driving power can be realized. Subsequently, the flow proceeds to a gate electrode forming process.

As is clear from the foregoing description, according to this invention, it is possible to increase the speed of hydrogen termination of a Si (100) surface, a Si (110) surface, a polycrystalline silicon surface, or an amorphous silicon surface, thereby realizing reliable termination.

INDUSTRIAL APPLICABILITY

This technique is applicable not only to the gate insulating film forming processes shown in the first embodiment and the second embodiment and the salicide-forming metal film forming process shown in the first embodiment, but also to a barrier metal forming process, a process of embedding a plug material into a contact hole, and so on.

The invention claimed is:

1. A semiconductor device manufacturing method, comprising hydrogen-terminating a region including a first semiconductor surface and a second semiconductor surface, wherein the first semiconductor surface is a (100) surface, and wherein the second semiconductor surface has relative to the (100) surface a low hydrogen termination speed in HF aqueous solution, using a solution containing at least $HF_2^-$ ions and an oxidant such that said second semiconductor surface is hydrogen-terminated with a hydrogen termination speed substantially the same as that of the first surface.

2. The semiconductor device manufacturing method according to claim 1, wherein said second semiconductor surface is silicon having a (111) surface, a (110) surface, or a (551) surface.

3. The semiconductor device manufacturing method according to claim 1, wherein said second semiconductor surface is silicon having a surface where a <111> axis perpendicular to a Si (111) surface is inclined in a <11-2> or <-1-12> axis direction.

4. The semiconductor device manufacturing method according to claim 1, wherein said second semiconductor surface is silicon having a surface substantially with a (110) surface orientation.

5. The semiconductor device manufacturing method according to claim 4, wherein said surface substantially with the (110) surface orientation is one of a (110) surface, a (551) surface, a (311) surface, a (221) surface, a (553) surface, a (335) surface, a (112) surface, a (113) surface, a (115) surface, a (117) surface, a (331) surface, a (221) surface, a (332) surface, a (111) surface, and a (320) surface.

6. The semiconductor device manufacturing method according to claim 1, wherein said second semiconductor surface is made of polycrystalline silicon.

7. The semiconductor device manufacturing method according to claim 1, wherein said second semiconductor surface is made of amorphous silicon.

8. The semiconductor device manufacturing method according to claim 1, wherein at least one of hydrogen peroxide, ozone, and an organic oxidant is contained as said oxidant.

9. The semiconductor device manufacturing method according to claim 1, wherein the solution containing the $HF_2^-$ ions and the oxidant contains at least one of HF and $NH_4F$.

10. The semiconductor device manufacturing method according to claim 1, wherein the surface of said region is rinsed with a solution containing pure water after hydrogen-terminating the surface of said region using the solution containing at least the $HF_2^-$ ions and the oxidant.

11. The semiconductor device manufacturing method according to claim 1, wherein at least one of a gate insulating film forming process, a salicide-forming metal film forming process, a barrier metal forming process, and a process of embedding a plug material into a contact hole is performed, after hydrogen-terminating the surface of said region using the solution containing at least the $HF_2^-$ ions and the oxidant and then rinsing the surface of said region with a solution containing pure water.

12. A semiconductor manufacturing apparatus for manufacturing a semiconductor device including hydrogen terminating a region including a first semiconductor surface and a second semiconductor surface, wherein the first semiconductor surface is a (100) surface, and wherein the second semiconductor surface has relative to the (100) surface a low hydrogen termination speed in HF aqueous solution, using a solution containing at least $HF_2^-$ ions and an oxidant such that said second semiconductor surface is hydrogen-terminated with a hydrogen termination speed substantially the same as that of the first semiconductor surface.

13. The semiconductor manufacturing apparatus according to claim 12, wherein said second semiconductor surface is silicon having a (111) surface, a (110) surface, or a (551) surface.

14. The semiconductor manufacturing apparatus according to claim 12, wherein said second semiconductor surface is silicon having a surface where a <111> axis perpendicular to a Si (111) surface is inclined in a <11-2> or <-1-12> axis direction.

15. The semiconductor manufacturing apparatus according to claim 12, wherein said second semiconductor surface is silicon having a surface substantially with a (110) surface orientation.

16. The semiconductor manufacturing apparatus according to claim 15, wherein said surface substantially with the (110) surface orientation is one of a (110) surface, a (551) surface, a (311) surface, a (221) surface, a (553) surface, a (335) surface, a (112) surface, a (113) surface, a (115) surface, a (117) surface, a (331) surface, a (221) surface, a (332) surface, a (111) surface, and a (320) surface.

17. The semiconductor manufacturing apparatus according to claim 12, wherein said second semiconductor surface is made of polycrystalline silicon.

18. The semiconductor manufacturing apparatus according to claim 12, wherein said second semiconductor surface is made of amorphous silicon.

19. The semiconductor manufacturing apparatus according to claim 12, wherein at least one of hydrogen peroxide, ozone, and an organic oxidant is contained as said oxidant.

20. The semiconductor manufacturing apparatus according to claim 12, wherein the solution containing the $HF_2^-$ ions and the oxidant contains at least one of HF and $NH_4F$.

21. The semiconductor manufacturing apparatus according to claim 12, wherein the surface of said region is rinsed with a solution containing pure water after hydrogen-terminating the surface of said region using the solution containing at least the $HF_2^-$ ions and the oxidant.

22. The semiconductor manufacturing apparatus according to claim 12, wherein at least one of a gate insulating film forming process, a salicide-forming metal film forming process, a barrier metal forming process, and a process of embedding a plug material into a contact hole is performed, after hydrogen-terminating the surface of said region using the solution containing at least the $HF_2^-$ ions and the oxidant and then rinsing the surface of said region with a solution containing pure water.

* * * * *